(12) United States Patent
Steinbuch

(10) Patent No.: US 6,989,781 B2
(45) Date of Patent: Jan. 24, 2006

(54) SHORT-RANGE RADAR SYSTEM WITH VARIABLE PULSE DURATION

(75) Inventor: Dirk Steinbuch, Wimsheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/392,022

(22) Filed: Mar. 19, 2003

(65) Prior Publication Data

US 2003/0206131 A1 Nov. 6, 2003

(30) Foreign Application Priority Data

May 4, 2002 (DE) ................ 102 20 073

(51) Int. Cl.
*G01S 13/10* (2006.01)
*G01S 13/22* (2006.01)

(52) U.S. Cl. ............... 342/85; 342/82; 342/89; 342/137

(58) Field of Classification Search .......... 342/89, 342/91, 92, 94, 95, 137, 120, 123, 70, 82, 342/85; 367/89, 91, 92, 94, 95, 120, 123, 367/137

See application file for complete search history.

(56) References Cited

U.S. PATENT DOCUMENTS

| | | | | | |
|---|---|---|---|---|---|
| 3,611,377 | A | * | 10/1971 | Rittenbach | 342/128 |
| 3,949,322 | A | * | 4/1976 | Morita | 331/113 R |
| 4,063,238 | A | * | 12/1977 | Conner, Jr. | 342/95 |
| 4,370,652 | A | * | 1/1983 | Lucchi | 342/101 |
| 4,881,040 | A | * | 11/1989 | Vaughn | 327/160 |
| 5,543,799 | A | * | 8/1996 | Heger | 342/85 |

* cited by examiner

*Primary Examiner*—Ian J. Lobo
(74) *Attorney, Agent, or Firm*—Michael J. Striker

(57) ABSTRACT

A short-range radar system includes short-range radar sensor means and means (41) for HF-impulse generator for the sensor means. The means for HF-impulse generation are embodied for emitting impulses with adjustable pulse duration (51, 53).

5 Claims, 4 Drawing Sheets

SHORT-RANGE RADAR SYSTEM WITH VARIABLE PULSE DURATION

BACKGROUND OF THE INVENTION

The present invention relates to a short-range radar system as well as a method for operating a short-range radar system.

From the state of the art, short-range radar systems for various automobile uses are known. The corresponding radar sensors operate according to the pulse-echo principle: an electromagnetic pulse of approximately 400 ps duration is emitted from the radar sensor; in the area surrounding the vehicle, the pulse contacts another vehicle, a limiting wall, or another obstacle, for example. The pulse reflected on the obstacle is detected and evaluated. The running time of the pulses and the frequency shift based on the Doppler Effect are the essential measured quantity, from which the distance and relative speed are determined.

At very close range, the pulse-echo measurement is operated with a center frequency of approximately 24 GHz. In this manner, the detection range around the sensor is subdivided into spherical layers, which are designated as "range gates". These "range gates" have a width of approximately 20 cm and are sensed by a pulse sequence. Within approximately 10 ms, the entire detection range is measured in the vehicle surrounding area in this manner.

From the state of the art, known uses for short-range radar sensor systems, for example, are parking assistance, collision forecasts, successive methods, tracking change assistance, and adaptive cruise control. Corresponding SRR radar sensor systems are available commercially available from the firm Robert Bosch GmbH, Stuttgart.

FIG. 1 shows a prior art HF-impulse generator 1, such as those that are used in commercially available short-range radar systems of the firm Robert Bosch GmbH. The HF-impulse generator 1 is closed or terminated by a high ohmic resistor 3 of 1.8 kΩ or 2.7 kΩ, for example.

If a corresponding control signal is emitted from a control apparatus 4 in the input 5 of the HF-impulse generator, this provides at its output 6 an HF-impulse of a predetermined pulse duration typically of 400 ps. This HF-impulse is input into the HF-switch 7.

The high ohmic resistor causes the current, which the switch diodes demodulate based on the negative pulse, to cause a positive voltage by means of this resistor. This voltage, the so-called back-bias voltage, suppresses the diodes, as long as no pulse is applied. If a negative pulse is injected, first the back-bias voltage is overcome and then the diodes are connected through.

FIG. 2 shows the voltage variation of a corresponding impulse for a resistor 3 of 2.7 kΩ. The diodes switch gate is −0.6 V, from which the resulting HF-pulse width is provided.

The short range around the motor vehicle, then, is sensed with a stable HF-pulse width 8. The achievable range of distance amounts to 7 m, for example.

An object of the present invention is to produce a short-range radar system with an enlarged range of distance.

SUMMARY OF THE INVENTION

The invention makes possible a broadening of the range of distance of a short-range radar system through a change of the HF-pulse width as a function of the sensed distance region. In this manner, the maximum range of distance of a short-range radar system is able to be increased up to 14 m or also to 30 m.

According to a preferred embodiment of the present invention, the operation of the short-range radar system takes place in a first distance range of, for example, up to 7 m with an essentially stable HF-pulse width, in order to retain a maximum selectivity in this distance range. In a second distance range of, for example, 7 to 14 m, the HF-pulse width is enlarged.

The enlargement of the HF-pulse width results in an increased distance range in connection with a smaller spatial selectivity. The reduced spatial selectivity in the second distance range, however, is not disadvantageous, since, based on the larger distance from obstacles in the second distance range for the various driver assistance systems, also only a minimal selectivity is required.

According to a further preferred embodiment of the invention, the pulse duration increased in the second distance range essentially linearly with increasing distance.

In accordance with a further preferred embodiment of the invention, HF-pulses with variable HF-pulse widths are produced, in which the high ohmic terminal resistance with a step recovery diode pulse generator, known from the state of the art, is replaced by low-ohmic resistor. The back bias-voltage is varied by an external signal. By changing the back bias-voltage, the diode switch point, and therewith, the HF-pulse width can be changed.

DETAILED DESCRIPTION OF THE PREFERRED EMBODIMENTS

Figure 3:
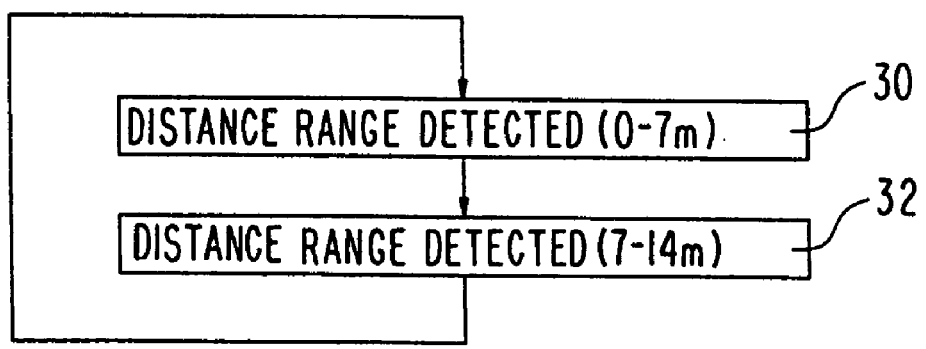
FIG. 3 is a flow diagram for illustrating an embodiment of the inventive method for operation a short-range radar system.

FIG. 3 shows a flow diagram for operating a short-range radar system. In step 30, the distance region of 0 m to 7 m in the detection region is sensed by the radar sensor of the short-range radar system. This takes place with a fixed impulse width, for example, of 400 ps, as is known in the state of the art.

In step 32, a further distance range, for example, of 7 m to 14 m is detected by the short-range radar sensor. In this second distance range, the detection takes place with an enlarged pulse width. For example, for the entire second detection range, a fixed, longer impulse width is selected. Preferably, the impulse width varies within the second distance region, for example, linearly increases with increasing distance.

Figure 4:
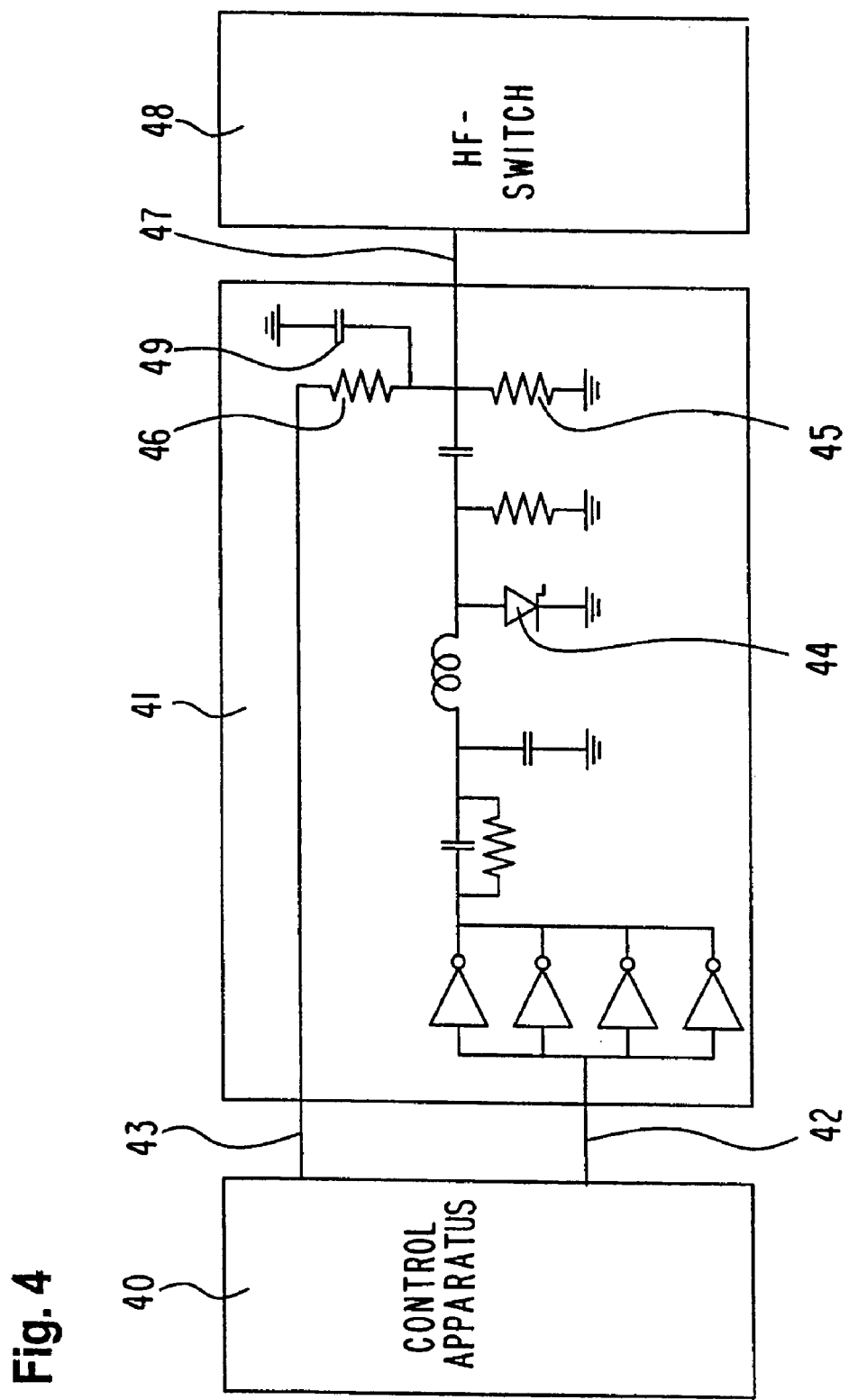
FIG. 4 is a block diagram of an embodiment of the inventive short-range radar system with an HF-impulse generator for producing HF-impulse adjustable HF-pulse width.

FIG. 4 shows a block diagram of an embodiment of an inventive short-range radar system. The short-range radar system includes a control apparatus 40, which controls an HF-impulse generator 41. The HF-impulse generator 41 has an input 42 for information from release signals from the control apparatus 40. Based on such release signals, the HF-impulse generator 41 produces an HF-impulse.

The HF-impulse generator 41, in addition, has an input 43, which is likewise connected with the control apparatus 40. Via the input 43, the HF-pulse width can be adjusted.

Figure 1:
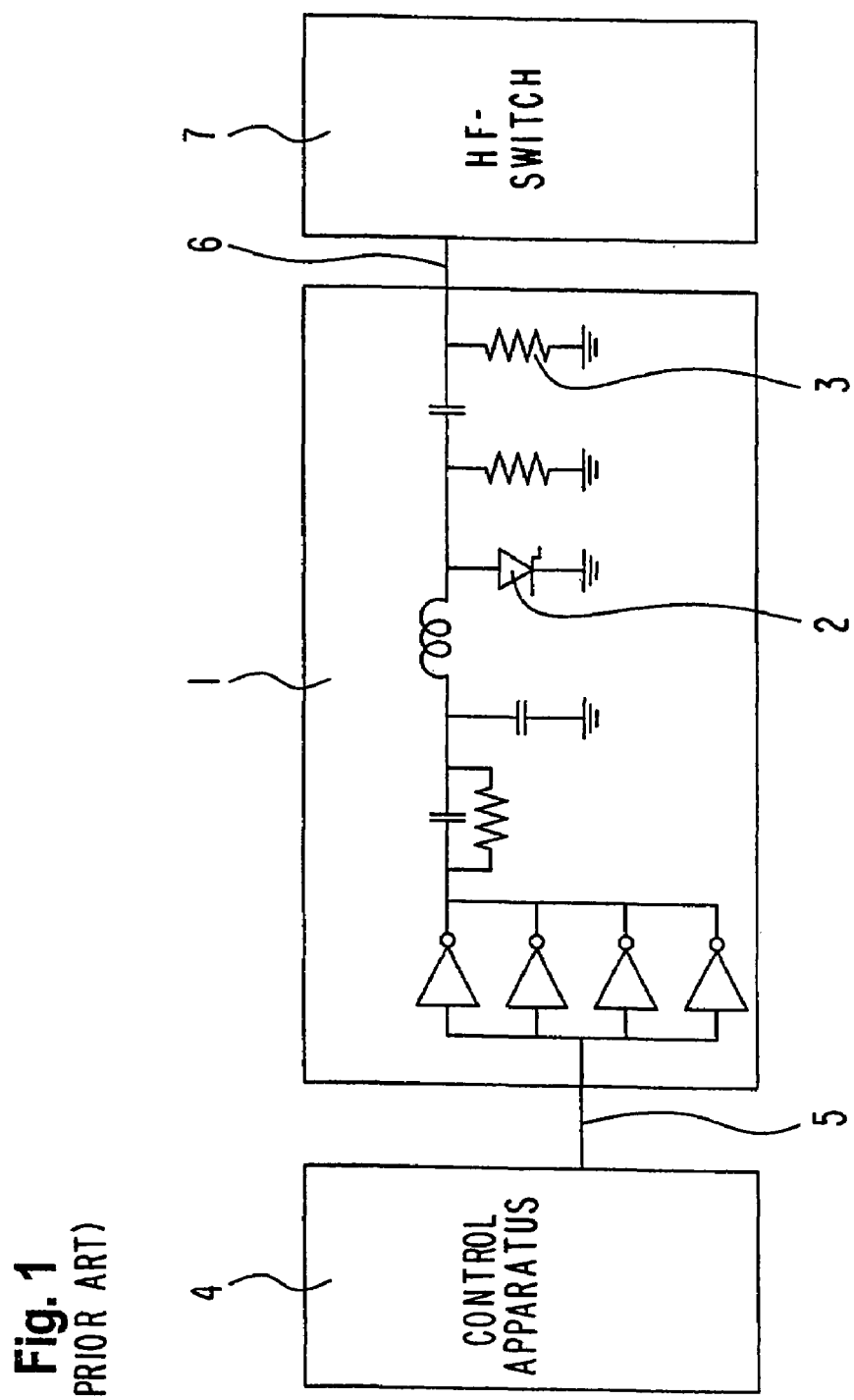
FIG. 1 is a block diagram of a short-range radar system with an HF-impulse generator, known from the state of the art.
Figure 2:
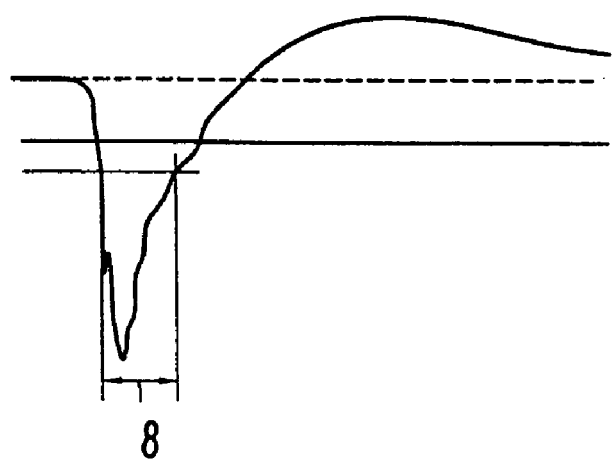
FIG. 2 shows an HF-impulse produced from the HF-impulse generator of FIG. 1.

The HF-impulse generator 41 is based on a step recovery diode 44, which is also the case with the HF-impulse generator 1 known from the state of the art (compare FIG. 1). In contrast to the HF-impulse generator 1, the HF-impulse generator 41 of FIG. 4 is closed or terminated by a low-ohmic resistor 45. The resistor 45 has a value of 50 Ω, for example. In this manner, first an effective back-bias voltage is no longer formed. In contrast, this is replaced by an externally injected voltage, which is applied via the resistor 46 to the switch input 47 of the HF-switch 48.

By applying a control voltage to the input 43, the effective back-bias voltage can be varied between 0 V and a positive voltage, whereby the HF-pulse width is adjusted. Because the base band pulse is not perfectly square, rather has a saw-tooth form, one can use the width difference of the pulse and by changing the back-bias voltage of the diode switch point, can change therewith the HF-pulse width.

Preferably, a condenser 49 is arranged between the input 47 and ground connection for interference elimination.

Figure 5:
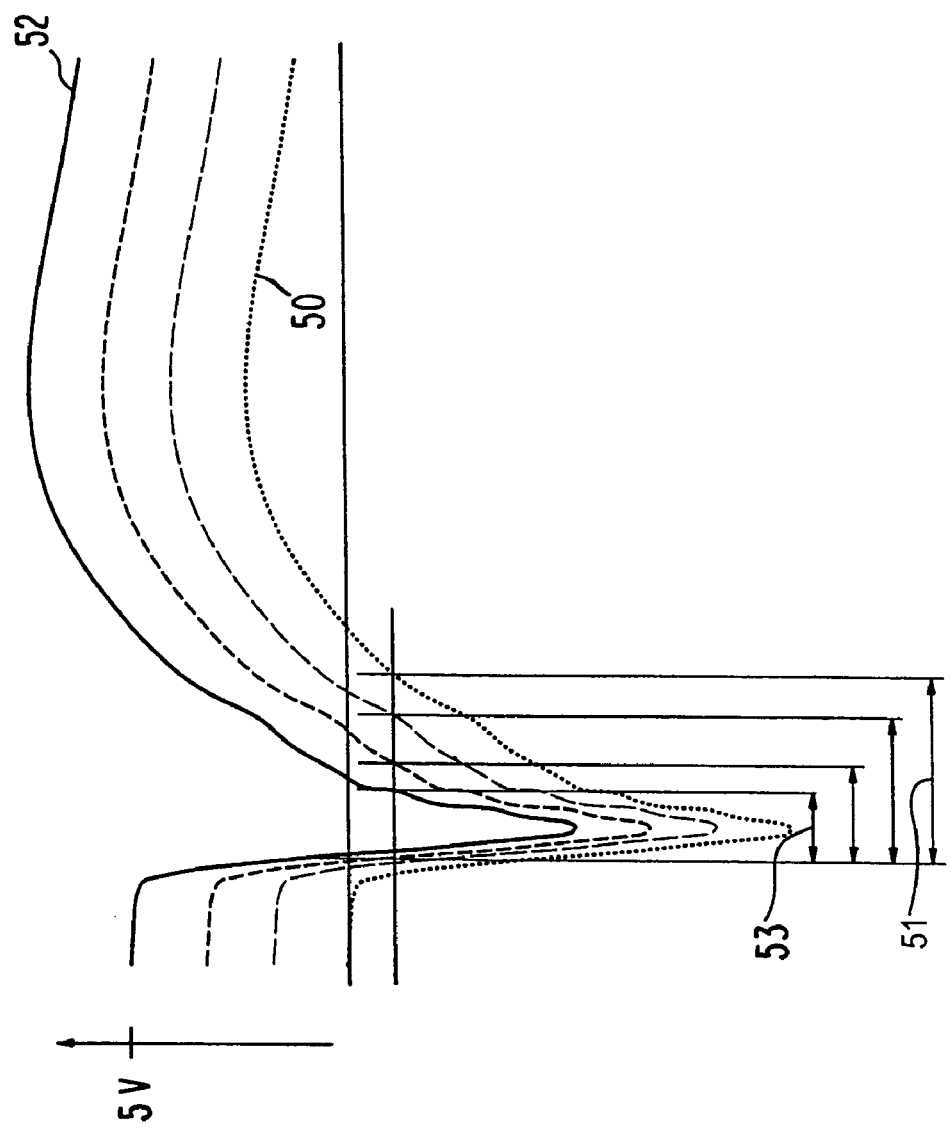
FIG. 5 shows HF-impulse various pulse widths, which are produced from the HF-impulse generator of FIG. 4.

FIG. 5 shows a corresponding signal course for various values of the back-bias voltage for a resistor 45 of 50 Ω and a diode switch gate of −0.6 V. One obtains the impulse 50 with a back-bias voltage of 0 V applied to the input 43 (compare FIG. 4). From it, the HF-pulse width 51 is provided. With a maximum back-bias voltage of 5 V applied to the input 43, one obtains by comparison the impulse 53 with the HF-pulse width 53, which amounts to less than half of the HF-pulse width 51. Between the HF-pulse widths 51 and 53, then, the HF-pulse width is able to be adjusted by corresponding changes to the back-bias voltage on the input 53.

A first distance region, then, for example, is operated with a back-bias voltage of 5 V, in order to obtain the short HF-pulse width 53 typically of 400 ps. For the further distance region, for example, of 7 m to 14 m, then, the HF-pulse width is varied, in which, for example, for the detection of the region from 7 m to 14 m, the back-bias voltage is lowered gradually. With the maximum distance of 14 m, the back-bias voltage reaches 0 V, so that one obtains the HF-pulse width 51.

It will be understood that each of the elements described above, or two or more together, may also find a useful application in other types of constructions differing from the types described above.

While the invention has been illustrated and described herein as a short-range radar system with variable pulse duration, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

What is claimed is:

1. A short-range radar system, comprising:
   short-range radar sensor means,
   means (41) for HF-impulse generation for the sensor means,
   wherein the means for HF-impulse generation emits impulses with adjustable pulse width of a transmitted pulse (51, 53) for operation in a first distance region, and wherein the means for adjustment of the pulse width of the transmitted pulse is embodied such that the pulse width of the transmitted pulse in a second distance region, which is farther away from the short-range radar system than the first distance region, increases with increasing distance, and
   wherein the means for HF-impulse generation has a step recovery diode-pulse generator (41) and means (43, 45, 46) for adjustment of a back-bias voltage.

2. The short-range radar system according to claim 1, wherein the means for adjustment of a pulse duration is embodied such that the pulse width of the transmitted pulse for a first distance region is held substantially constant, and the pulse width of the transmitted pulse for a second distance region is varied outside of the first distance region.

3. The short-range radar system according to claim 2, wherein the increase of the pulse width of the transmitted pulse in the second distance region is substantially linear.

4. A method for operating a short-range radar sensor having the following steps:
   operating the short-range radar sensor with a substantially fixed HF-impulse width in a first distance region,
   operating the short-range radar sensor with a variable HF-impulse width in a second distance region outside of the first distance region, wherein the HF-impulse width in the second distance region is increased with increasing distance, and
   wherein for the HF-impulse generation, a step recovery diode-pulse generator is used, wherein said step recovery diode-pulse generator is terminated with a low-ohmic resistor, and wherein adjustment of the HF-impulse width takes place by adjustment of a back-bias voltage.

5. The method according to claim 4, wherein the increase of the impulse width in the second distance region takes place substantially linearly with increasing distance.

* * * * *